United States Patent
Roy et al.

(10) Patent No.: US 6,295,517 B1
(45) Date of Patent: *Sep. 25, 2001

(54) METHOD AND APPARATUS FOR ADAPTIVELY OR SELECTIVELY CHOOSING EVENT-TRIGGERED CYCLE-BASED SIMULATION OR OBLIVIOUS-TRIGGERED CYCLE-BASED SIMULATION ON A CLUSTER-BY-CLUSTER BASIS

(75) Inventors: Arnob Roy, Bangalore (IN); Sanjay Malpani, Santa Clara, CA (US); Alok Kuchlous, Bangalore (IN)

(73) Assignee: Synopsis, Inc., Mountain View, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/057,021

(22) Filed: Apr. 7, 1998

(51) Int. Cl.[7] .................................... G06F 17/50
(52) U.S. Cl. ................................................ 703/15
(58) Field of Search ................ 395/500.35, 500.37; 703/14, 15

(56) References Cited

U.S. PATENT DOCUMENTS

| | | | |
|---|---|---|---|
| 5,081,601 | * 1/1992 | Eirikasson | 395/500.38 |
| 5,369,604 | * 11/1994 | Ravindranath et al. | 702/119 |
| 5,392,227 | * 2/1995 | Hiserote | 395/500.35 |
| 5,696,942 | * 12/1997 | Palnitkar et al. | 395/500.35 |
| 5,856,933 | * 1/1999 | Maurer | 395/500.37 |

* cited by examiner

Primary Examiner—Kevin J. Teska
Assistant Examiner—Hugh Jones
(74) Attorney, Agent, or Firm—Jonathan T. Kaplan; Brown Raysman Millstein Felder & Steiner LLP

(57) ABSTRACT

A simulation architecture and method having four major steps. Firstly, an input circuit description to be simulated is compiled into an initial circuit compilation as follows. The input circuit description is translated into an initial register transfer level (RTL) network representation comprised of sequential and/or combinational objects. Next, translation of the RTL network into a network of clusters is accomplished. In general, a cluster is a region of the circuit which has uniform simulation activity. The initial clustering process, by default, chooses an simulation mode for all clusters known as event-triggered cycle-based. The other possible simulation mode for a cluster, in accordance with the present invention, is oblivious-triggered cycle-based. The first major step completes with translating the network of clusters into simulatable object code which includes additional object code that generates activity data regarding each cluster during a simulation. In the second major step, part of the complete suite of test vectors, such portion being known as profile test vector subset, is simulated upon the object code of the initial circuit compilation to produce activity data. For the third major step the input circuit description to be simulated is compiled again, but is optimized utilizing the activity data. The activity data is used to decide which clusters should either be merged into larger event-triggered cycle-based clusters or individually switched from event-triggered cycle-based simulation to oblivious-triggered cycle-based simulation. The simulation mode is chosen, or clusters are merged, on a cluster-by-cluster basis, to optimize simulation efficiency (and therefore minimize simulation time). Finally, in the fourth major step the optimized circuit compilation is simulated with the full suite of test vectors.

8 Claims, 7 Drawing Sheets

US 6,295,517 B1

METHOD AND APPARATUS FOR ADAPTIVELY OR SELECTIVELY CHOOSING EVENT-TRIGGERED CYCLE-BASED SIMULATION OR OBLIVIOUS-TRIGGERED CYCLE-BASED SIMULATION ON A CLUSTER-BY-CLUSTER BASIS

FIELD OF THE INVENTION

The present invention relates generally to the simulation of digital electronic circuits which have been described at a register transfer level. More specifically, the present invention relates to determining the most efficient mode for simulating clusters of a circuit description.

BACKGROUND OF THE INVENTION

To tackle the increasing complexity of digital electronic circuits, designers need faster methods of simulating such circuits, particularly in light of ever-shrinking product development times.

The complexity of designing such circuits is often handled by expressing the design in a high-level hardware description language (HDL) such as Verilog.

High-level HDLs allow the designer to save design time by permitting him or her to express the desired functionality at the register transfer level (RTL) of abstraction or higher. The high-level HDL description is then synthesized into an actual circuit through a process, well known to those of ordinary skill in the art, of translation and optimization.

High-level HDLs describe, directly or indirectly, the two main kinds of circuit entities of an RTL circuit description: i) state devices or sequential logic which store data upon application of a clock signal, and ii) combinational logic. The state devices typically act as either: i) an interface between conceptually distinct circuit systems, or ii) storage for the results of functional evaluation performed by the combinational logic.

In order to verify the functionality of such high-level HDL descriptions, it is usually desirable to simulate the circuit thereby produced before actually manufacturing it.

Simulation can occur at a variety of levels of modeling abstraction. Known example levels of modeling abstraction are: transistor, gate, register transfer and behavioral. Typically, the lower the level of abstraction, the more accurate the simulation. Typically, however, the lower the level of abstraction the greater is the amount of time required to perform the simulation.

Simulation time can be a significant limitation upon a designer's ability to explore a variety of design alternatives and therefore it is almost always desirable to achieve a simulation time which is as short as possible.

Conventional simulators assume that the level of simulation activity, throughout a design to be simulated, is uniform. Simulation activity is determined by the rate at which signal levels, within circuit elements being simulated, change. If the level of activity is assumed to be uniformly low, then it is desirable to simulate using an event-triggered mode in which evaluation is performed only for those circuit elements whose signal levels are changing. Alternatively, if the level of activity is assumed to be uniformly high, then it is desirable to simulate using an oblivious cycle-based mode in which all circuit elements are evaluated upon every clock cycle since the scheduling overhead inherent in any event-triggered approach is avoided.

However, typical designs have non-uniform activity levels due to their components having different characteristics. Examples of different types of components, each of which is often associated with a different level of simulation activity, are: controller unit, datapath unit, memory unit and input/output unit.

Therefore, certain regions of a digital electronic system may have high levels of simulation activity, while other regions of the system may have low levels of activity.

SUMMARY OF THE INVENTION

The present invention is addressed to a simulation architecture in which a circuit designer proceeds according to the following major steps: i) an input circuit description to be simulated is compiled into an initial circuit compilation, ii) part of the complete suite of test vectors, such portion being known as the profile test vector subset, is simulated upon the initial circuit compilation to produce activity data, iii) the input circuit description to be simulated is compiled again, but is optimized utilizing the activity data, and iv) the optimized circuit compilation is simulated with the full suite of test vectors.

The present invention is addressed to RTL simulation and any circuit description from which an RTL netlist can be inferred can be used as input.

The first major step of initial circuit compilation proceeds as follows. The input circuit description is translated into an initial RTL network representation including sequential and/or combinational objects. Next, translation of the RTL network into a network of clusters is accomplished. In general, a cluster is a region of the circuit which has uniform characteristics. The identification of clusters operates as follows. The program starts at a register (or state device) in the RTL network and for each of its inputs traces the fanin. The cluster thereby produced comprises a register and all of the traced fanin combinational circuitry driving its inputs. As discussed below, certain conditions occurring during the tracing can also lead to the creation of clusters composed entirely of combinational circuitry.

The initial clustering process, by default, chooses a simulation mode for all clusters that is known as event-triggered cycle-based (defined below). The other possible simulation mode for a cluster, in accordance with the present invention, is oblivious-triggered cycle-based (defined below).

The next (and second) major step in utilizing the simulation architecture, as discussed above, is to simulate the object code produced by the initial circuit compilation upon a portion of the complete suite of test vectors, such portion being known as a Profile Test Vector Subset file, to produce an Activity Data file containing simulation activity data regarding each individual cluster. This is possible because the initial circuit compilation includes additional object code which causes it to output the simulation activity of its clusters.

In the third major step of utilizing the simulation architecture, the designer again compiles the circuit to be simulated, but this compilation is optimized utilizing the Activity Data file. As part of the process of producing the optimized compilation, a Profile Analyzer must be run upon the Activity Data file. The Profile Analyzer takes the Activity Data file as input, calculates the simulation activity of each cluster and based upon the simulation activity produces as output a Cluster Directives file that indicates which clusters (all of which are event-triggered cycle-based by default) can either be merged into larger event-triggered cycle-based clusters or individually switched from an event-triggered cycle-based simulation mode to an oblivious-triggered cycle-based simulation mode. The Cluster Directives file is read by another program, known as Adaptive Clustering, as part of the optimized compilation to produce a network of clusters in which the evaluation mode has been chosen, or clusters have been merged, on a cluster-by-cluster basis, to optimize simulation efficiency (and therefore minimize simulation time).

The event-triggered cycle-based mode is more efficient than oblivious-triggered cycle-based if the simulation activity of the cluster is low. Oblivious-triggered cycle-based is more efficient than event-triggered cycle-based if the simulation activity of the cluster is high.

Therefore, if the simulation activity of a cluster is low, the Profile Analyzer will not produce a directive and therefore leave the cluster as event-triggered cycle-based. If the simulation activity of a cluster is high, the Profile Analyzer will produce a directive for the Cluster Directives file causing the cluster's mode of simulation to switch to oblivious-triggered cycle-based. If the simulation activity of a cluster is medium (between high and low), then the Profile Analyzer will leave the cluster as event-triggered cycle-based but will produce a directive for the Cluster Directives file marking it as a candidate for merging. The Adaptive Clustering program will then seek to merge all candidates for merging.

The optimized compilation, resulting from this third major step of utilizing the simulation architecture of the present invention, does not include additional object code which causes it to output the simulation activity of its clusters.

In the fourth (and last) major step in utilizing the simulation architecture of the present invention, the optimized circuit compilation is simulated with the full suite of test vectors.

Subsequent to this full simulation, it is often the case that the designer will continue to make relatively small changes to the input circuit description which affect only a small percentage of the design's clusters. In this case, the designer need do only one recompile of the input circuit description to produce an optimized compilation upon which the full test suite may be run again. Only one recompile of the input circuit description is necessary because the Cluster Directives file (produced from the previous run of the Profile Analyzer) can be reused to optimize those clusters which are unchanged from the initial circuit compilation.

In accordance with the purpose of the invention, as embodied and broadly described herein, the present invention is a method performed in a circuit simulation process, comprising the steps performed by a data processing system of: identifying a plurality of clusters within a circuit design to be simulated; and selecting, for each of the plurality of clusters, a mode of simulation from a plurality of simulation modes, wherein a first cluster of the plurality of clusters has a first simulation mode selected and a second cluster of the plurality of clusters has a different second simulation mode selected.

In further accordance with the purpose of the invention, as embodied and broadly described herein, the present invention is a method performed in a circuit simulation process, comprising the steps performed by a data processing system of: identifying a first cluster, within a circuit design to be simulated, for evaluation upon the occurrence of a clock signal of a first clock; and identifying a second cluster, within the circuit design to be simulated, for evaluation upon the occurrence of a clock signal of a second clock and a change to an input of the second cluster.

In further accordance with the purpose of the invention, as embodied and broadly described herein, the present invention is a method performed in a circuit simulation process, comprising the steps performed by a data processing system of: identifying a plurality of clusters within a circuit design to be simulated; and selecting a first and a second cluster of the plurality of clusters for merging to form a third cluster wherein the selecting is based upon activity data of the clusters.

Advantages of the invention will be set forth, in part, in the description that follows and, in part, will be understood by those skilled in the art from the description or may be learned by practice of the invention. The advantages of the invention will be realized and attained by means of the elements and combinations particularly pointed out in the appended claims and equivalents.

BRIEF DESCRIPTION OF THE DRAWINGS

The accompanying drawings, that are incorporated in and constitute a part of this specification, illustrate several embodiments of the invention and, together with the description, serve to explain the principles of the invention.

DETAILED DESCRIPTION OF PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

Figure 1:
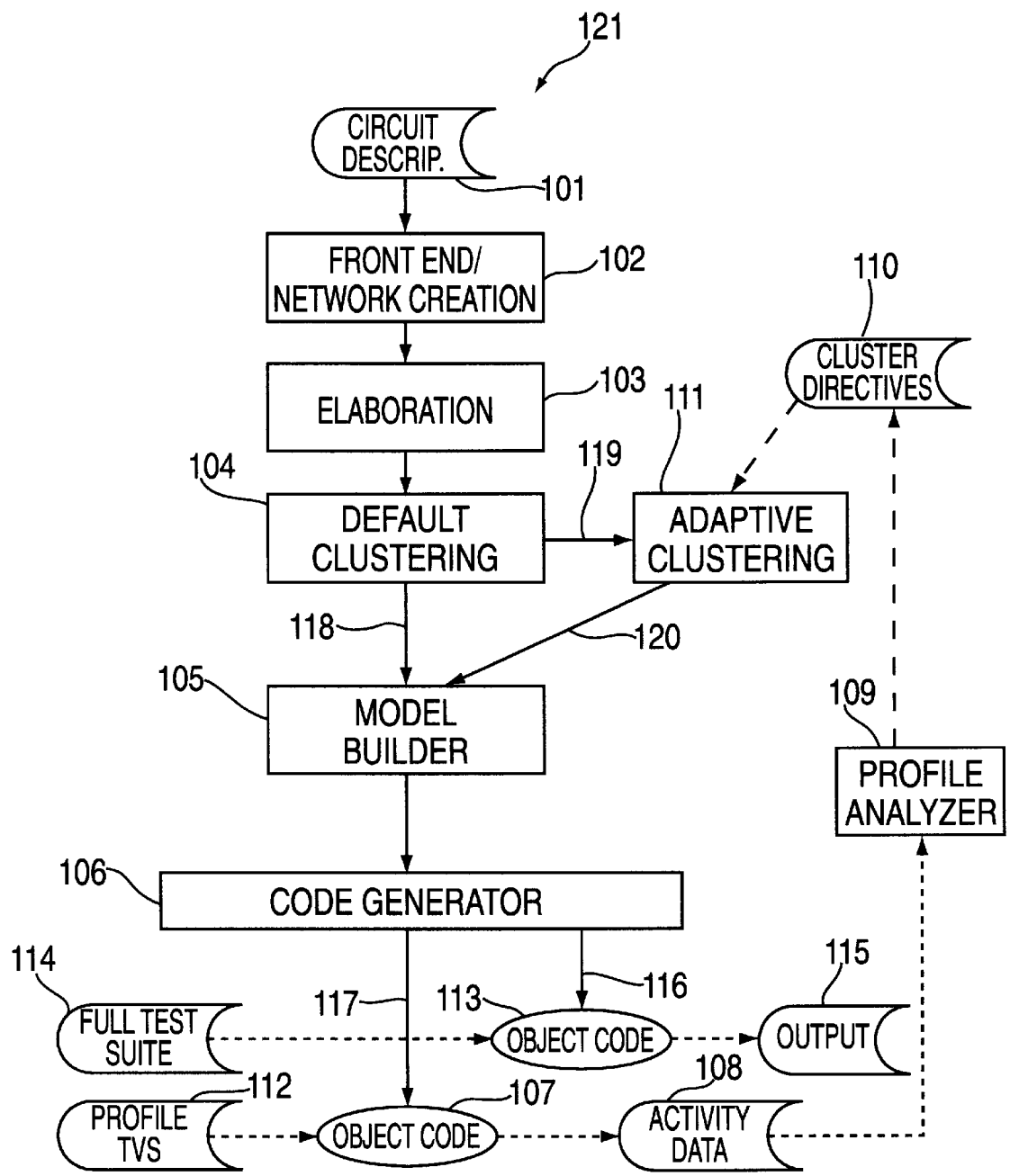
FIG. 1 depicts an overview of the simulation architecture utilizing the principles of the present invention.

Referring now to FIG. 1, an overview of the simulation architecture utilizing the principles of the present invention is shown. FIG. 1 will be explained in the context of the typical process by which a circuit designer would use the simulation architecture to achieve the advantages of the present invention.

The basic process by which a circuit designer would use the simulation architecture comprises the following major steps: i) the circuit design to be simulated is compiled into an initial circuit compilation, ii) part of the complete suite of test vectors, such portion being known as profile test vector subset, is simulated upon the initial circuit compilation to produce activity data, iii) the circuit design to be simulated is compiled again, but is optimized utilizing the activity data, and iv) the optimized circuit compilation is simulated with the full suite of test vectors.

The compilation of the circuit design into its initial form takes as its input Circuit Description 101 and proceeds through the execution of the following programs: Front-end/Network Creation 102, Elaboration 103, Default Clustering 104, Model Builder 105 and Code Generator 106. Each of these initial circuit compilation steps is described below.

A circuit designer inputs a Circuit Description 101 of the circuit to be simulated. Circuit Description 101 is typically a high-level HDL language, with Verilog being merely an exemplary high-level HDL suitable for input to a simulation system utilizing the principles of the present invention. Any high-level HDL, which can be compiled into an RTL description, can be used as input. In fact, any input circuit description from which an RTL netlist can be inferred, including circuit descriptions at a lower level than RTL (such as the gate or transistor level), can be used.

Front-end/Network Creation 102 performs two main operations. First, it identifies those portions of the Circuit Description 101 which can be simulated in accordance with the principles of the present invention and those portions which require alternative circuit simulation techniques. The present invention is addressed to RTL simulation. The circuit designer, however, may require that certain portions of the Circuit Description 101 be simulated at higher or lower levels of modeling abstraction. Such portions are separated out by Front-end/Network Creation 102 and converted into an alternative conventional circuit representation suitable for conventional simulation techniques.

The second main operation of Front-end/Network Creation 102 is the translation of those portions of Circuit Description 101, which can be simulated in accordance with the principles of the present invention, into an initial RTL network representation comprised of sequential and/or combinational objects. In the case of high-level HDL input (such as Verilog), a parser infers the semantics of the syntactic input, such as whether a particular language construct represents a state device or combinational logic. If a lower than RTL HDL input language is being used, then Front-end/Network Creation 102 would extract an RTL network.

Front-end/Network Creation 102 also appropriately interfaces any alternative conventional circuit representation produced with the initial RTL network so that the simulation in accordance with the present invention can interact appropriately with any conventional simulation.

For example, a designer might want to simulate a large portion of a complex circuit design at a behavioral level in a programming language such as C. Front-end/Network Creation 102 would separate out the C language portion of the design for simulation at the behavioral level with an appropriate interface to the portion of the design simulatable at RTL. In the case of Verilog, the Programming Language Interface (PLI) would be used for interfacing a C model to an RTL netlist.

Elaboration 103 is responsible for connecting the RTL netlist, inferred in previous step of Front-end/Network Creation 102, across the entire design. As of the previous step of Front-end/Network Creation 102, the RTL netlist only existed within block definitions and was inferred for block instances. The connection performed by Elaboration 103 involves resolving the instantiation of blocks with their definition and creating appropriate interfaces between block instances. At the end of this phase a flattened RTL netlist for the entire design is available. For example, if an input language construct calls for iteratively instantiating a block definition, the literal instantiation of the number of blocks called for by the iteration would be performed at this time. Performance of this step also implies that any hierarchical information regarding the relationship between block instances is eliminated. The output of Elaboration 103 is a netlist representation comprising sequential and/or combinational logic objects.

The next step is Default Clustering 104. Before discussing the specifics of how initial clustering is accomplished, the definition of a cluster is presented.

In general, a cluster is a region of the circuit which has uniform characteristics. As discussed above, determining that an entire circuit has a uniform characteristic of low or high simulation activity allows for determination of whether the entire circuit should be simulated according to an event-triggered or oblivious cycle-based mode. In accordance with the present invention, dividing a circuit into clusters allows a simulation mode to be chosen for each cluster which is most efficient given its level of simulation activity. Specifically, those clusters with a low level of activity are simulated according to an event-triggered cycle-based mode (defined below), while those clusters with a high level of activity are simulated according to an oblivious-triggered cycle-based mode (defined below).

Figure 2:
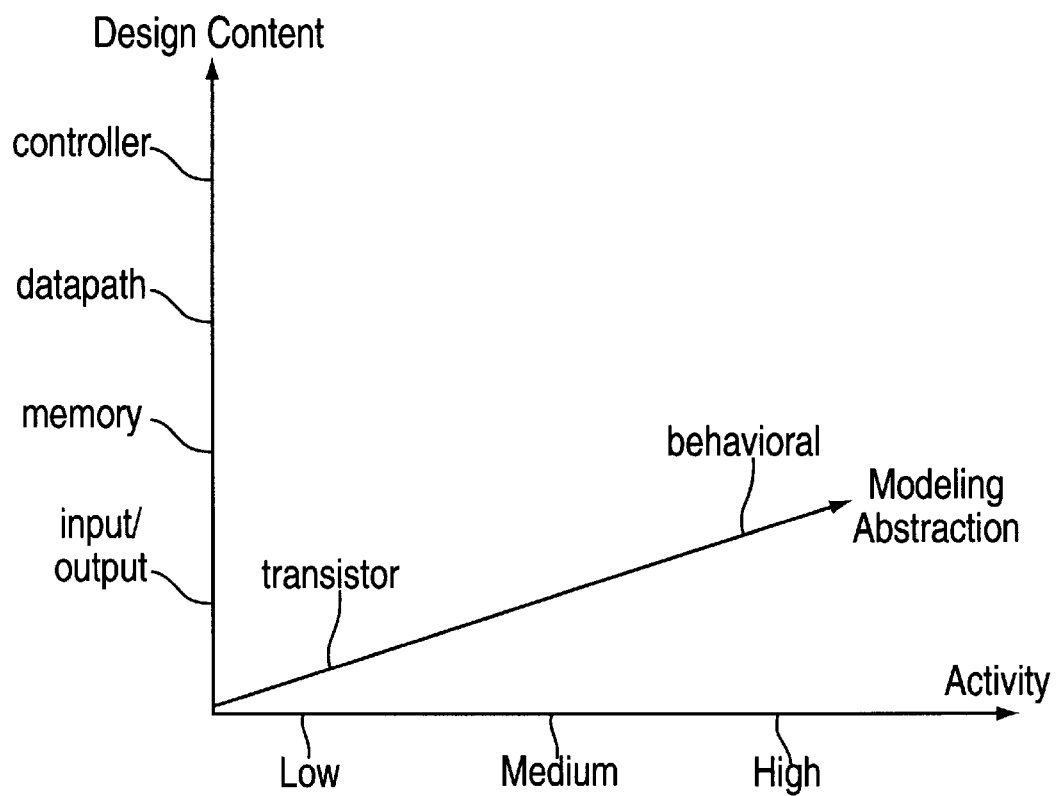
FIG. 2 renders a three-dimensional space defined by the three primary axes about which a cluster is evaluated.

There are two other primary "axes," besides the level of simulation activity, under which a cluster is classified: design content and the level of circuit modeling abstraction. These three axes are depicted in FIG. 2 which shows simulation activity (which is a continuum from low to high) as the horizontal axis, design content (which is typically not a continuum but merely a selection of alternatives) as the vertical axis and level of modeling abstraction (which is a continuum from low-level abstraction to high-level abstraction) as the depth or "Z" axis. Each cluster is typically chosen such that it is uniform with respect to all three axes and therefore may be mapped to a particular point in this three-dimensional space.

The design content axis typically denotes a selection of computational architectures for which a cluster may be applied. The architectures would typically include controller units, datapath units, memory units or input/output units. A datapath unit typically performs a specific computation on its input data set. A control unit typically selects the data set on which the computation is to be performed. Input/output units perform the interface with the external environment.

The level of modeling abstraction axis denotes a continuum along which the level of abstraction of a cluster may be specified. As discussed above, this may range across the following levels: transistor, gate, register transfer and behavioral. Typically, the level of modeling abstraction will mainly influence the determination of a cluster's evaluation algorithm as selected by Model Builder 105 described below.

Figure 3:
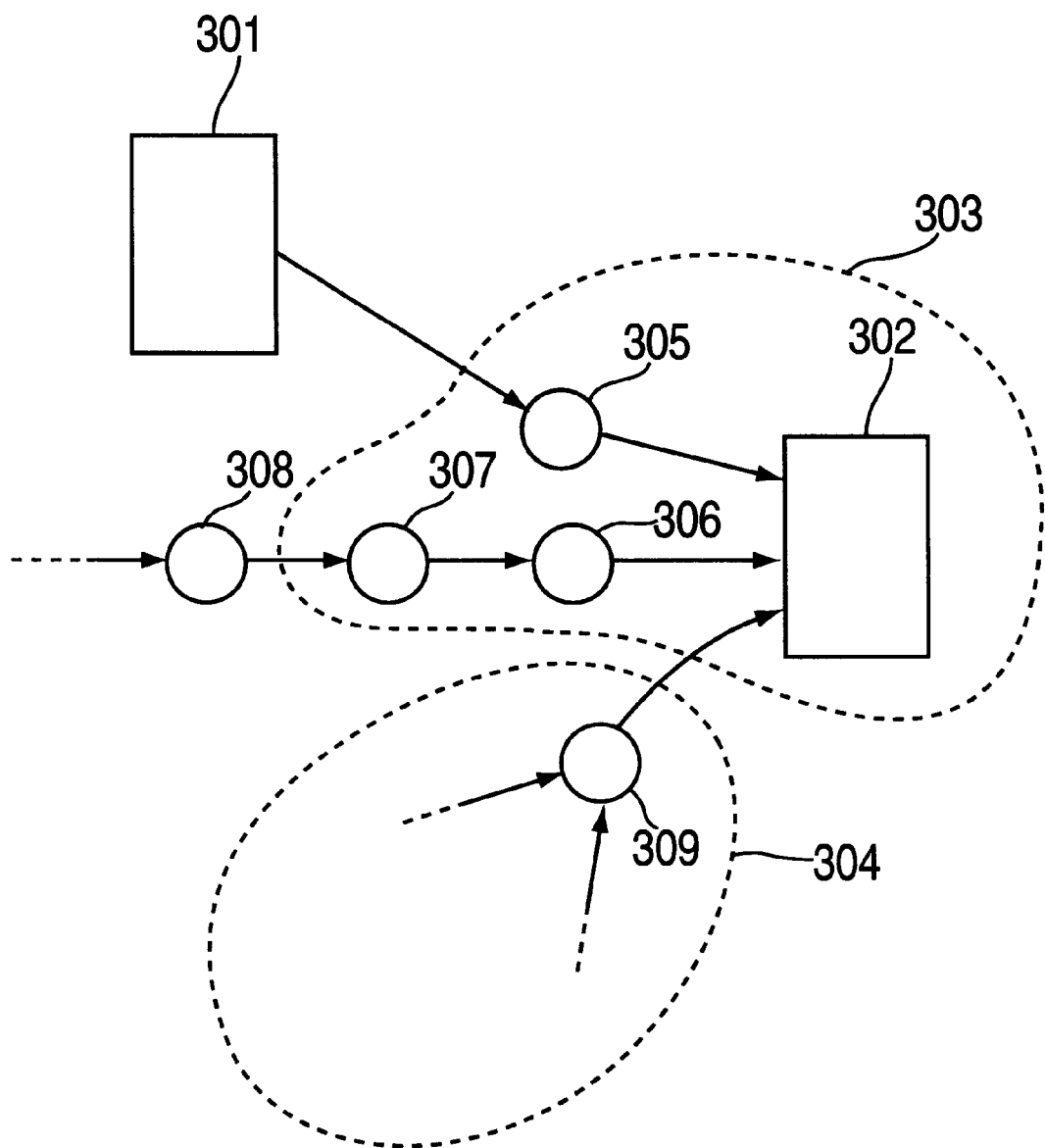
FIG. 3 illustrates the initial identification of clusters in an RTL network in accordance with the present invention.

The Default Clustering step 104 preferably operates as follows. The program starts at a register (or state device), in the network generated through Elaboration 103, and for each of its inputs traces the fanin. As can be seen in FIG. 3, the tracing proceeds through all combinational circuitry driving each input and ends when either: i) the output of a register is reached, ii) an output of another cluster is reached or iii) the number of levels of logic traced through exceeds a particular level. The cluster thereby produced includes a register and all of the traced fanin combinational circuitry driving its inputs (back through a predetermined number of levels). As discussed below, condition iii) can also have the effect of initiating the creation of clusters composed entirely of combinational circuitry.

Condition ii) is addressed to the fact that clusters may overlap. Typically, this occurs where a single combinational gate output ultimately drives an input of two separate registers. In this case, it can be seen that each register's fanin will ultimately trace back to the same gate output. Overlapping of clusters can be dealt with either by duplicating the overlapping logic or by terminating the cluster upon encountering another cluster. The described method is to terminate the fanin search upon encountering another cluster.

Condition iii) has the purpose of preventing clusters from getting too large. If clusters are allowed to become too large they may contain both high-activity and low-activity regions and thus violate the basic assumption upon which the advantages of the present invention are based. If this condition is triggered, then gates subsequently traced will form a cluster (or clusters if the condition is triggered again) comprised entirely of combinational gates.

FIG. 3 depicts a cluster 303 which is formed by beginning at a register 302 and tracing the fanin of each of its inputs. Cluster 303 ends at the input to combinational unit 305 since 305, in accordance with condition i), is driven by the output of register 301. Cluster 303 ends at the input to combinational unit 307 since condition iii) is assumed in this case to limit tracing to two levels of logic. Therefore, combinational unit 308 is the beginning of a cluster which is composed entirely of combinational units. In accordance with condition ii), cluster 303 ends at cluster 304. Since combinational unit 309 is part of a cluster 304, combinational unit 309 must ultimately drive some register (not shown) other than register 302.

The present invention introduces two simulation modes known as event-triggered cycle-based and oblivious-triggered cycle-based. Default Clustering 104 makes every cluster event-triggered cycle-based. The other possible mode for a cluster, in accordance with the present invention, is oblivious-triggered cycle-based.

These two simulation modes will be defined according to the following two parameters: the means by which the mode decides which circuit elements to evaluate and the means by which the mode decides when to evaluate the selected circuit elements.

The event-triggered cycle-based mode is defined as follows. With respect to which circuit elements are to be evaluated, this mode: i) evaluates any cluster having a changed input and ii) for any cluster with a changed input the entire cluster is evaluated at one time—there are no scheduled events within a cluster. With respect to when selected elements are evaluated, this mode evaluates upon the occurrence of a clock cycle for the selected cluster. The clock for a cluster is defined, in general, to be the clock triggering any registers included in the cluster. If a cluster does not include a register, its clock is the clock triggering any register having any input driven by the cluster.

The oblivious-triggered cycle-based mode is defined as follows. With respect to which circuit elements are to be evaluated, this mode: i) evaluates any cluster selected for this mode and ii) for any cluster selected for this mode the entire cluster is evaluated at one time—there are no scheduled events within a cluster. With respect to when selected elements are evaluated, this mode evaluates upon the occurrence of a clock cycle for the selected cluster. The clock for a cluster is the same as defined above.

The two conventional simulation modes, upon which the simulation modes of the present invention are based, are typically called event-triggered and oblivious cycle-based. In keeping with the terminology utilized for describing the two simulation modes of the present invention, these two simulation modes shall be referred to, respectively, as event-triggered event-based and global-triggered cycle-based.

Event-triggered event-based simulation is defined as follows. With respect to which circuit elements are to be evaluated, this mode: i) evaluates any circuit element having a changed input—there are scheduled events within a cluster. With respect to when selected elements are evaluated, this mode causes evaluation upon the occurrence of the change to the circuit element's input—evaluation is not delayed until a clock cycle.

Global-triggered cycle-based simulation is defined as follows. With respect to which circuit elements are to be evaluated, this mode: evaluates the entire circuit to be simulated. With respect to when selected elements are evaluated, this mode evaluates upon the occurrence of a clock cycle for the simulated circuit. The clock or clocks for the circuit is any clock triggering any register of the circuit.

Event-triggered cycle-based and oblivious-triggered cycle-based cluster simulation share two commonalities: i) the time when a cluster is evaluated is at the occurrence of a clock cycle, and ii) the entire cluster is evaluated at that one time—there are no scheduled events within a cluster. Oblivious-triggered cycle-based simulation is distinguished from event-triggered cycle-based simulation by the fact that the cluster is evaluated upon every clock cycle. Oblivious-triggered cycle-based simulation is distinguished from conventional global-triggered cycle-based simulation in that global-triggered cycle-based simulation assumes that the entire circuit design must be evaluated upon every clock cycle whereas the oblivious-triggering of the present invention permits the specification of oblivious cycle-based simulation on a cluster-by-cluster basis within the entire circuit design. Event-triggered cycle-based simulation is distinguished from oblivious-triggered cycle-based simulation in that only clusters which have a changed input are evaluated. Event-triggered cycle-based simulation is distinguished from conventional event-triggered event-based simulation in that event-triggered event-based simulation: i) occurs whenever an input to a circuit element changes (not just upon the occurrence of a clock cycle) and ii) occurs only for those circuit elements whose inputs have changed (and not for the entire cluster).

As part of Default Clustering 104, once the initial clusters are identified, a topological sort of the cluster graph is performed in order to assign a level number to each cluster. Levelization is accomplished as follows. Clusters with primary inputs are assigned a level of zero. Any other cluster is assigned a level one higher than the maximum level of any cluster driving one of its inputs. For each clock cycle of a clock line, all clusters having that clock line, regardless of whether the cluster is oblivious-triggered cycle-based or event-triggered cycle-based, are evaluated in ascending levelization order. Levelization is performed purely for efficiency purposes. It ensures that a cluster is evaluated only once after all of the inputs which might affect that particular evaluation have changed.

For initial circuit compilation, Model Builder 105 is run next (Adaptive Clustering 111 occurs in optimized compilation). The Model Builder 105 analyzes the static properties of the functional component of each cluster, in the network of clusters output by Default Clustering 104, to select an appropriate evaluation algorithm for that functional component. These static properties are determined, of the three cluster axes discussed above, mainly by the level of modeling abstraction axis and the design content axis. Such static properties of a functional component include: the level of modeling abstraction of the functional component, the design content of the functional component, the number of inputs and outputs of the functional component, the number of inputs and outputs of the basic elements which form the functional component and the number of levels of the basic elements between the inputs and outputs of the functional component. Typical evaluation algorithms include: BDD-based evaluation, selective trace and table lookup. In BDD-based evaluation the logic function is represented by a Binary Decision Diagram and is evaluated by traversing the diagram with the input values. With selective trace, paths are traced from the inputs to the outputs while checking for change in the intermediate circuit node values before proceeding further along the path. In table lookup the logic function is represented as a two-dimensional table which maps input values to its appropriate output value.

The level of modeling abstraction of the functional component, for example, can affect the selection of an evaluation algorithm as follows. The result of Front-end/ Network Creation 102 and Elaboration 103 is to identify the sequential and combinational (or functional) components of the design. The level of modeling abstraction for the functional components themselves, however, may vary across the full spectrum discussed above from transistor level to behavioral level. If, for example, the level of modeling abstraction for a functional component is gates, then BDD-based evaluation would be appropriate (whereas BDD-based evaluation would probably not be chosen if the functional component is specified at the behavioral level).

Design content can be determined as follows. A control unit is typically determined from the number of conditional constructs in the circuit description. A datapath unit can be identified by its significant use of arithmetic components, such as adders, multipliers, or logical units, in conjunction with vector data types. Memories can be recognized by the use of two-dimensional arrays and its read/write logic.

If a cluster is identified as being part of a multi-level logic datapath, for example, table lookup might be chosen for its evaluation algorithm due to its inherent speed.

The Code Generator 106 takes the network of clusters, annotated with evaluation algorithm selections by Model Builder 105, and generates the low level Object Code 107 which is actually run to simulate the circuit. For this initial circuit compilation, Code Generator 106 adds additional object code which monitors the activity of the clusters at simulation time.

Figure 5A:
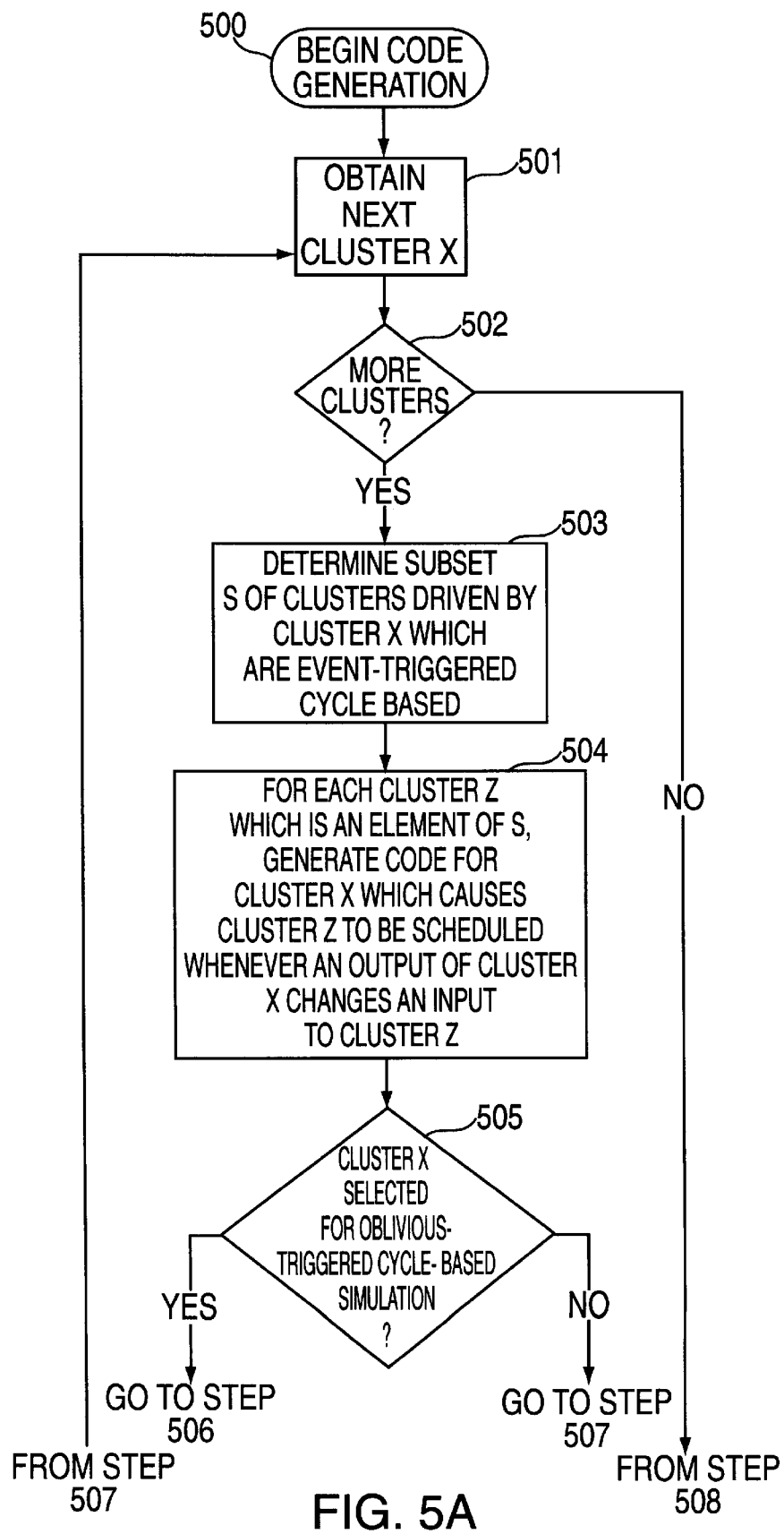
FIGS. 5A–B depicts the process by which simulation object code is generated in a compilation in accordance with the present invention.
Figure 5B:
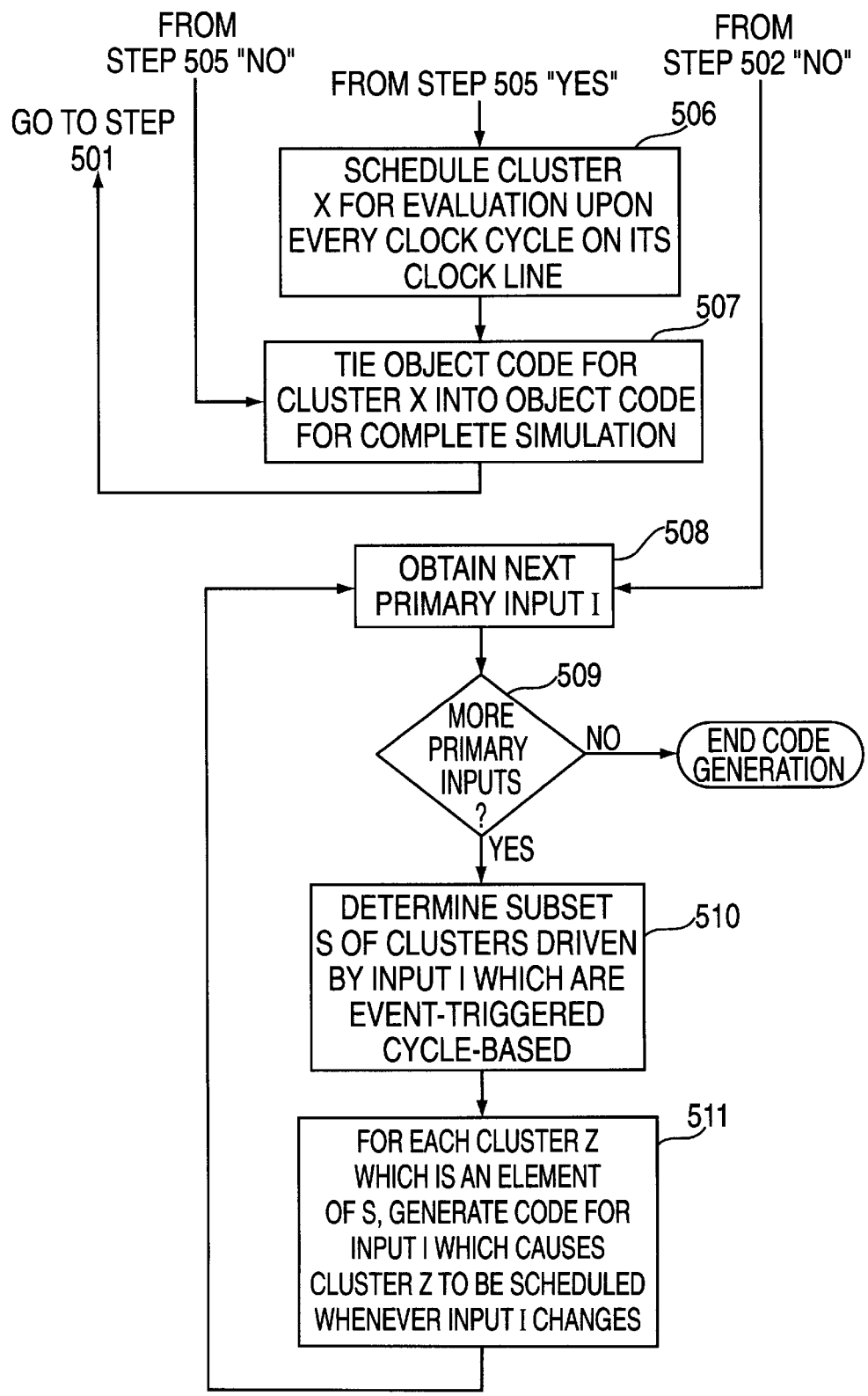

As shown in FIGS. 5A–5B, each cluster in the network of clusters is obtained by step 501. While there are more clusters to be processed, according to step 502, object code causing the appropriate clusters to be event-triggered cycle-based is produced by step 503–504. For the initial circuit compilation: i) step 504 also adds to the object code generated for each cluster X additional object code which causes each cluster to output its activity data, and ii) steps 505–506 will never schedule a cluster X for oblivious-triggered cycle-based simulation. Step 507 then ties in the object code for the cluster with the object code for all the other clusters to form a complete circuit simulation. Each primary input is then obtained by step 508. While there are more primary inputs to be processed, according to step 509, object code causing the appropriate clusters to be event-triggered cycle-based is produced by steps 510–511.

The next (and second) major step in utilizing the simulation architecture of FIG. 1, as discussed above, is to simulate the initial circuit compilation 107 upon a portion of the complete suite of test vectors, such portion being known as the Profile Test Vector Subset file 112 (depicted as Profile TVS 112 in FIG. 1) discussed above, to produce the Activity Data file 108 (also discussed above) containing simulation activity data regarding each individual cluster. In order to obtain a more accurate measurement of cluster activity, the designer may simulate several different Profile Test Vector Subset files (representing several different selections from the complete suite of test vectors) in order to produce several different Activity Data files.

As discussed above, in the third major step of utilizing the simulation architecture, the designer again compiles the circuit to be simulated, but this compilation is optimized utilizing Activity Data file 108. This compilation takes as input Circuit Description 101 and proceeds through the execution of programs: Front-end/Network Creation 102, Elaboration 103, Default Clustering 104, Adaptive Clustering 111, Model Builder 105 and Code Generator 106. The repetition of Front-end/Network Creation 102, Elaboration 103 and Default Clustering 104, performed previously in producing the initial circuit compilation, may be avoided by reusing the network of clusters output by Default Clustering 104. As part of the process of producing the optimized compilation, Profile Analyzer 109 must also be run upon Activity Data file 108 before the execution of Adaptive Clustering 111. Each of these optimized compilation steps (other than Front-end/Network Creation 102, Elaboration 103 and Default Clustering 104) is described below.

Profile Analyzer 109 takes Activity Data file 108 as input and produces as output a Cluster Directives file 110 which indicates which clusters (all of which are event-triggered cycle-based by default) can either be merged into larger event-triggered cycle-based clusters or should be individually switched from event-triggered cycle-based to oblivious-triggered cycle-based. Profile Analyzer 109 analyzes Activity Data file 108, in order to produce Cluster Directives file 110, as follows.

The Activity Data file 108, produced by simulating the initial circuit compilation Object Code 107 upon Profile Test Vector Subset file 112, is organized as follows. Each cluster of the initial circuit compilation has a unique identifier (ID). With each ID is stored: i) the number of times evaluation of the cluster was triggered (NUM_E), during simulation of the profile test vector subset, by changes at the cluster's input, and ii) the total number of clock cycles applied to the cluster (NUM_C) over the course of the simulation.

An activity ratio is defined as $$\frac{NUM\_E}{NUM\_C},$$

and can never be greater than one. An activity ratio is calculated by Profile Analyzer 109 for each cluster.

If the activity ratio of a cluster is high (meaning "close" to one), then Profile Analyzer 109 will produce a directive (for Cluster Directives file 110) to switch the evaluation of the cluster to oblivious-triggered cycle-based. Typically, the activity ratio is considered to be high, based upon experimental investigation, if its value is in the range from 0.5 to 1.0, inclusive, but other appropriate ranges could also be used.

Alternatively, if the activity ratio of a cluster is low (meaning "close" to zero), then Profile Analyzer 109 will not produce a directive and therefore leave evaluation of the cluster as event-triggered cycle-based. Typically, the activity ratio is considered to be low, based upon experimental investigation, if its value is in the range from 0.2 to 0.0, inclusive, but other appropriate ranges could also be used.

If the activity ratio of a cluster is medium (meaning neither high nor low), then Profile Analyzer 109 will: i) leave the cluster as event-triggered cycle-based, and ii) generate a directive indicating that the cluster is mergeable. Medium is that range for the activity ratio which is between the high range and the low range. Based upon the typical ranges presented above, the activity ratio is considered to be medium if its value is greater than 0.2 and less than 0.5.

It is advantageous, however, to allow the high and low ranges of the activity ratios to be controllable by the designer. This allows the designer to select those ranges which may be most effective for the designer's particular circuit designs and test vectors.

Merging of clusters works with keeping clusters event-driven for the following reason. Let E represent the amount of time required to evaluate a cluster, and let S represent the amount of time required to schedule a cluster if its evaluation is event-triggered cycle-based. The cost of having the cluster be event-triggered cycle-based, during the course of a simulation, is NUM_E*(E+S), whereas the cost of having the cluster be oblivious-triggered cycle-based is NUM_C* E. While NUM_E is almost always less than NUM_C, E+S is greater than E. Merging, however, makes E larger and therefore reduces the significance of S.

As discussed above, the designer may decide to simulate several Profile Test Vector Subset files to produce several corresponding Activity Data files. In this case, Profile Test Vector Subset file 112 is understood to represent several Profile Test Vector Subset files and Activity Data file 108 is understood to represent several corresponding Activity Data files. For each Activity Data file of Activity Data file 108, Profile Analyzer 109 independently calculates (in the same manner discussed above) a separate set of activity ratios. Therefore, if there are n Activity Data files, each cluster ID will have n activity ratios. Typically, the average of the n activity ratios is computed and this average activity ratio is utilized by Profile Analyzer 109, in the same manner as discussed above, to determine whether the activity ratio of the cluster is high, low or medium and produce the appropriate directives for Cluster Directives file 110.

Adaptive Clustering 111 takes as input the network of clusters from Default Clustering 104 and Cluster Directives file 110 to produce a modified cluster network. Adaptive Clustering 111 merges together all mergeable clusters which have been indicated as being candidates for merging by a directive in Cluster Directives file 110.

Clusters can be merged if they are adjacent Two clusters are adjacent, for the purposes of merging, if there is any direct flow of data between the clusters. The direct connection between the clusters can be either through a combinational gate or through a register. A direct connection is a physically wired connection between two clusters.

Merging of clusters is limited, however, by certain boundary conditions. Firstly, clusters driven by different clocks, even if adjacent, are not merged. Secondly, one a cluster has reached a certain maximum size, no further clusters are merged into it. The size of a cluster, for purposes of limiting merging, may be measured, for example, as the sum of: i) the total number of state devices the cluster contains, plus ii) the total number of basic elements forming each functional component within the cluster.

As with the initial circuit compilation, Model Builder 105 still looks at static properties of the functional components of clusters in selecting evaluation algorithms for the clusters. The difference in producing the optimized circuit compilation being that Model Builder 105 is accepting its input cluster network from Adaptive Clustering 111 rather than Default Clustering 104.

As with the initial circuit compilation, Code Generator 106 still generates the low level simulation object code. The difference in producing the optimized circuit compilation code 113 being that Code Generator 106 does not generate the additional code for monitoring cluster activity and the simulation object code generated for a cluster may be either event-triggered cycle-based or oblivious-triggered cycle-based.

Therefore, FIGS. 5A–5B operate in the same manner as described above with respect to initial circuit compilation, however, i) step 504 does not generate code for each cluster X causing it to output its activity data, and ii) steps 505–506 may cause a cluster X to be scheduled for oblivious-triggered cycle-based simulation.

Finally, as the last (and fourth) major step in utilizing the simulation architecture of the present invention, the optimized circuit compilation 113 is simulated with the full suite of test vectors 114 to produce an Output file 115.

Subsequent to this full simulation, it is often the case that the designer will continue to make relatively small changes to the input circuit description which effect only a small percentage of the design's clusters. In this case, the designer need only recompile the input circuit description once before running the full test suite again. In recompiling after a small change to the input circuit description, unlike recompiling for optimization after an initial circuit compilation, the steps of Front-end/Network Creation 102, Elaboration 103 and Default Clustering 104 must be repeated as well as repeating the steps of Adaptive Clustering 111, Model Builder 105 and Code Generator 106. Only one recompile of the input circuit description is necessary because Cluster Directives file 110 (produced from the previous run of Profile Analyzer 109) can be reused upon those clusters which are unchanged from the initial circuit compilation. Cluster Directives file 110 can be reused because the IDs for the unchanged clusters in the recompiled network, produced by Default Clustering 104, either remain the same as, or can be easily mapped to, the IDs of the previously produced Cluster Directives file 110. In this case, Adaptive Clustering 111 always leaves the changed clusters as event-driven, but does examine whether these changed clusters can be merged.

In summary, it can be seen that the initial circuit compilation differs from the optimized compilation in proceeding directly from Default Clustering 104 to Model Builder 105 as indicated by arrow 118 and also differs in producing Object Code 107 which includes code for monitoring activity data. Optimized compilation proceeds from Default Clustering 104 to Adaptive Cluster 111 and then the Model Builder 105, as indicated by arrows 119 and 120. In addition, optimized compilation requires that Profile Analyzer 109 be run upon Activity Data 108 prior to the execution of Adaptive Clustering 111 and results in an Object Code 107.

Figure 4:
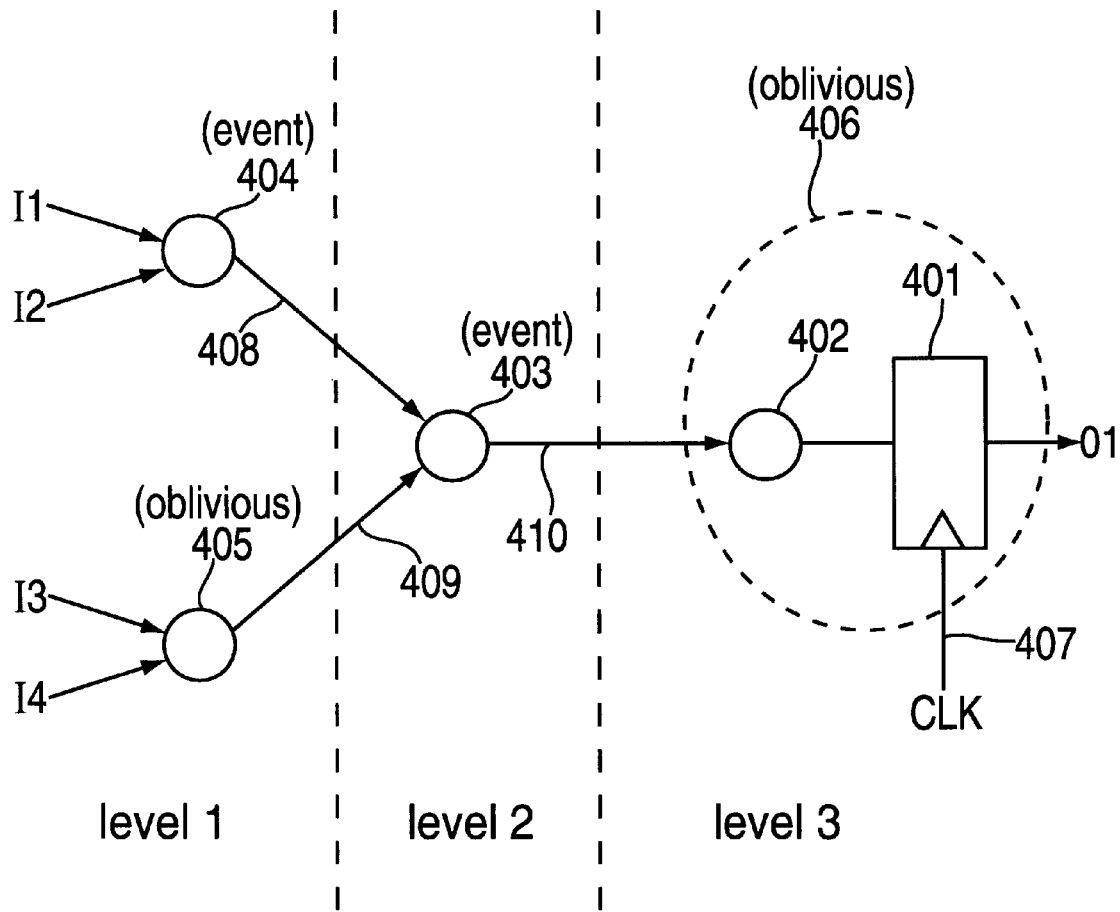
FIG. 4 depicts an example optimized circuit compilation for simulation in accordance with the present invention.

FIG. 4 provides an example of how an optimized circuit compilation may evaluate. FIG. 4 comprises combinational units 402–405 and register 401. The combination of register 401 and combinational unit 402 comprise cluster 406. Combinational unit 403 comprises, by itself, a cluster 403. Likewise, combinational units 404 and 405 each comprise, by themselves, clusters 404 and 405. It is assumed that optimization, based upon activity data, has caused clusters 406 and 405 to be oblivious-triggered cycle-based, while clusters 404 and 403 have been left event-triggered cycle-based. All four of the clusters depicted in FIG. 4 share the same clock line 407. The clusters have also been levelized, in accordance with the procedure described above, such that clusters 404 and 405 are of level 1, cluster 403 is of level 2 and cluster 406 is of level 3. The circuit of FIG. 4 has primary inputs I1-I4 and primary output O1.

For each clock cycle to occur on clock line 407, the clusters of FIG. 4 will be simulated as follows. Assume that as of when the clock cycle is applied to clock line 407 there has been a change only to primary input I1. First the level 1 clusters 404 and 405 may be evaluated. In this case, since we have assumed a change to primary input I1, cluster 404 will be evaluated. Cluster 405 is also evaluated, even though there have been no changes to its inputs, since is has been scheduled as oblivious triggered. Next the level 2 clusters are considered. Specifically, the level 2 cluster 403 may be evaluated. If we assume that the evaluation of cluster 404 causes a change to input 408 of cluster 403, then the evaluation of cluster 404 caused cluster 403 to be scheduled for evaluation. Therefore, cluster 403 would now be evaluated, even though it was not originally scheduled for evaluation when the clock cycle upon clock line 407 first occurred. Finally the level 3 clusters are considered for evaluation. Specifically, cluster 406 is evaluated, regardless of whether the evaluation of cluster 403 produced a change on its input 410, since it has been scheduled as oblivious triggered.

HARDWARE ENVIRONMENT

Figure 6:
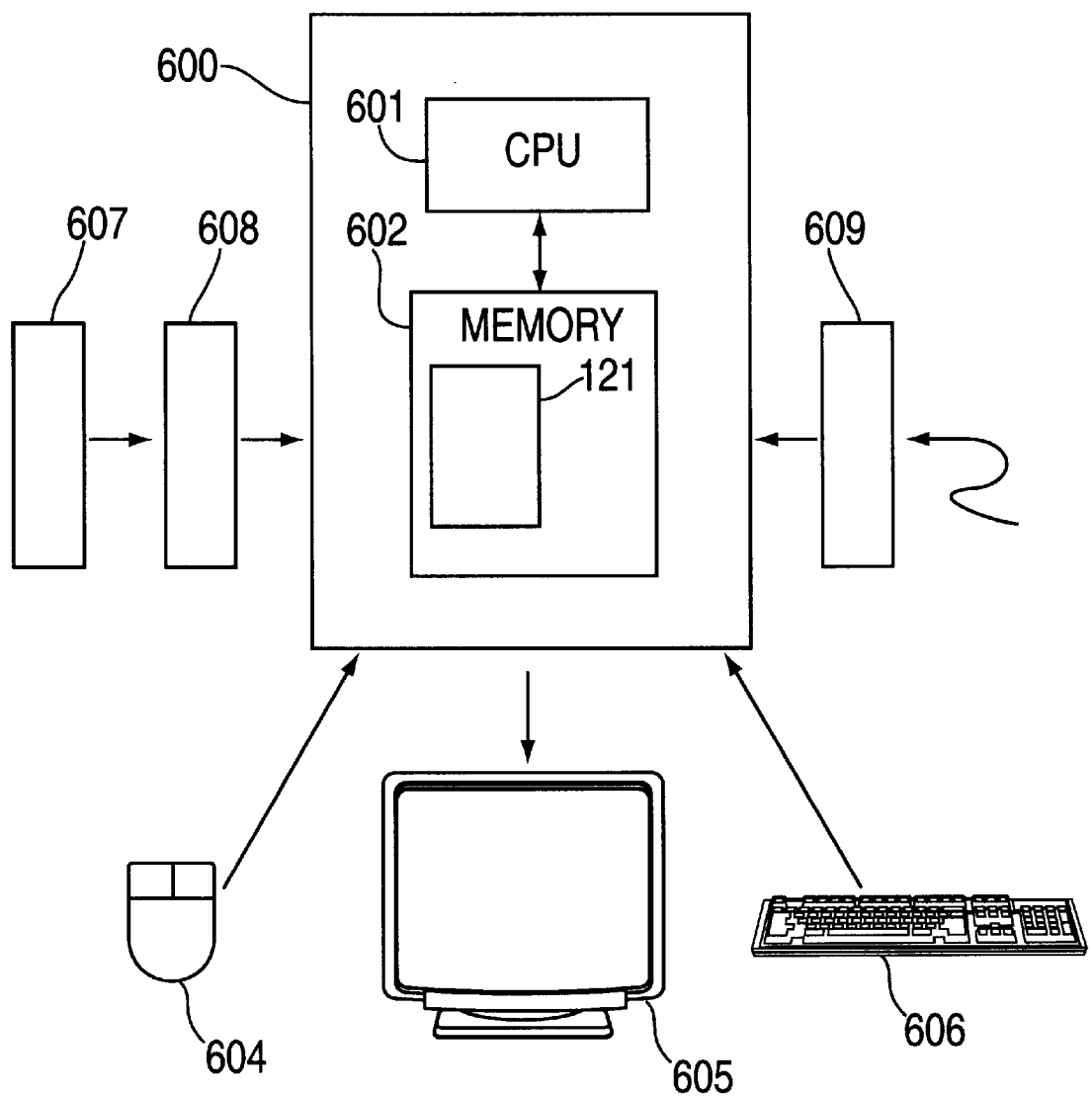
FIG. 6 illustrates the typical hardware computing environment in which the software in accordance with a preferred embodiment of the present invention is executed.

Typically, the simulation architecture 121 of FIG. 1 of the present invention is executed within the computing environment (or data processing system) such as that of FIG. 6. FIG. 6 depicts a workstation computer 600 comprising a Central Processing Unit (CPU) 601 (or other appropriate processor or processors) and a memory 602. Memory 602 has a portion of its memory in which is stored the software tools and data 121 of the present invention. While memory 603 is depicted as a single region, those of ordinary skill in the art will appreciate that, in fact, such software may be distributed over several memory regions or several computers. Furthermore, depending upon the computer's memory organization (such as virtual memory), memory 602 may comprise several types of memory (including cache, random access memory, hard disk and networked file server). Computer 600 is typically equipped with a display monitor 605, a mouse pointing device 604 and a keyboard 606 to provide interactivity between the software of the present invention and the chip designer. Computer 600 also includes a way of reading computer readable instructions from a computer readable medium 607, via a medium reader 608, into the memory 602. Computer 600 also includes a way of reading computer readable instructions via the Internet (or other network) through network interface 609.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. A method performed in a circuit simulation process, comprising the steps performed by a data processing system of:

identifying a plurality of clusters within a circuit design to be simulated;

selecting, for each of the plurality of clusters, a mode of simulation from either an oblivious-triggered cycle-based mode or an event-triggered cycle-based mode, wherein a first cluster of the plurality of clusters has a first simulation mode selected and a second cluster of the plurality of clusters has a different second simulation mode selected;

wherein the selecting, for at least one of the plurality of clusters, is based upon activity data for the at least one cluster; and wherein the activity data is an activity ratio.

2. A method performed in a circuit simulation process, comprising the steps performed by a data processing system of:

identifying a plurality of clusters within a circuit design to be simulated;

selecting a first and a second cluster of the plurality of clusters for merging to form a third cluster wherein the selecting is based upon activity data of the clusters, wherein the third cluster is simulated according to an event-triggered cycle-based mode; and wherein the activity data is an activity ratio.

3. A data processing system for circuit simulation, comprising:

a circuit configured to identify a plurality of clusters within a circuit design to be simulated;

a circuit configured to select, for each of the plurality of clusters, a mode of simulation from either an oblivious-triggered cycle-based mode or an event-triggered cycle-based mode, wherein a first cluster of the plurality of clusters has a first simulation mode selected and a second cluster of the plurality of clusters has a different second simulation mode selected;

wherein the circuit configured to select selects, for at least one of the plurality of clusters, based upon activity data for the at least one cluster; and wherein the activity data is an activity ratio.

4. A data processing system for circuit simulation, comprising:

a circuit configured to identify a plurality of clusters within a circuit design to be simulated;

a circuit configured to select a first and a second cluster of the plurality of clusters for merging to form a third cluster wherein the selecting is based upon activity data of the clusters, and wherein the third cluster is simulated according to an event-triggered cycle-based mode;

wherein the activity data is an activity ratio.

5. A computer program product comprising:

a computer usable medium having computer readable code embodied therein for causing circuit simulation, the computer program product including:

computer readable program code devices configured to cause a computer to effect identifying a plurality of clusters within a circuit design to be simulated; and computer readable program code devices configured to cause a computer to effect selecting, for each of the plurality of clusters, a mode of simulation from either an oblivious-triggered cycle-based mode or an event-triggered cycle-based mode, wherein a first cluster of the plurality of clusters has a first simulation mode selected and a second cluster of the plurality of clusters has a different second simulation mode selected, wherein the selecting, for at least one of the plurality of clusters, is based upon activity data for the at least one cluster, and wherein the activity data is an activity ratio.

6. A computer program product comprising:

a computer usable medium having computer readable code embodied therein for causing circuit simulation, the computer program product including:

computer readable program code devices configured to cause a computer to effect identifying a plurality of clusters within a circuit design to be simulated; and computer readable program code devices configured to cause a computer to effect selecting a first and a second cluster of the plurality of clusters for merging to form a third cluster wherein the selecting is based upon activity data of the cluster wherein the third cluster is simulated according to an event-triggered cycle-based mode, and wherein the activity data is an activity ratio.

7. An electronic data signal representing sequences of instructions which, when executed by a processor, cause circuit simulation, by performing the steps of:

identifying a plurality of clusters within a circuit design to be simulated;

selecting, for each of the plurality of clusters, a mode of simulation from either an oblivious-triggered cycle-based mode or an event-triggered cycle-based mode, wherein a first cluster of the plurality of clusters has a first simulation mode selected and a second cluster of the plurality of clusters has a different second simulation mode selected;

wherein the selecting, for at least one of the plurality of clusters, is based upon activity data for the at least one cluster; and wherein the activity data is activity ratio.

8. An electronic data signal representing sequences of instructions which, when executed by a processor, cause circuit simulation, by performing the steps of:

identifying a plurality of clusters within a circuit design to be simulated; and selecting a first and a second cluster of the plurality of clusters for merging to form a third cluster wherein the selecting is based upon activity data of the clusters, wherein the third cluster is simulated according to an event-triggered cycle-based mode; and wherein the activity data is an activity ratio.

* * * * *